(12) United States Patent
Zhu et al.

(10) Patent No.: US 9,842,847 B2
(45) Date of Patent: Dec. 12, 2017

(54) DRAIN SELECT GATE FORMATION METHODS AND APPARATUS

(71) Applicant: Micron Technology, Inc., Boise, ID (US)

(72) Inventors: Hongbin Zhu, Boise, ID (US); Lijing Gou, Boise, ID (US); Gordon Haller, Boise, ID (US); Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 14/619,243

(22) Filed: Feb. 11, 2015

(65) Prior Publication Data

US 2016/0233225 A1    Aug. 11, 2016

(51) Int. Cl.
*H01L 27/1156* (2017.01)
*H01L 27/11556* (2017.01)
*H01L 27/11582* (2017.01)

(52) U.S. Cl.
CPC .. *H01L 27/11556* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 2011/0024818 A1* | 2/2011 | Ahn | ............... | H01L 21/28273 257/314 |
| 2011/0156044 A1* | 6/2011 | Lee | ............... | G11C 16/3427 257/60 |
| 2014/0159144 A1* | 6/2014 | Cheng | ............... | H01L 29/42368 257/330 |
| 2015/0333078 A1* | 11/2015 | Colinge | ............... | H01L 21/28282 257/316 |
| 2015/0348989 A1* | 12/2015 | Pekny | ............... | H01L 27/11568 257/325 |
| 2015/0364487 A1* | 12/2015 | Yun | ............... | H01L 27/1157 257/324 |

* cited by examiner

*Primary Examiner* — Reema Patel
*Assistant Examiner* — Steven Christopher
(74) *Attorney, Agent, or Firm* — Schwegman Lundberg & Woessner, P.A.

(57) ABSTRACT

Some embodiments include a string of charge storage devices formed along a vertical channel of semiconductor material; a gate region of a drain select gate (SGD) transistor, the gate region at least partially surrounding the vertical channel; a dielectric barrier formed in the gate region; a first isolation layer formed above the gate region and the dielectric barrier; a drain region of the SGD transistor formed above the vertical channel; and a second isolation layer formed above the first isolation layer and the drain region, wherein the second isolation layer includes a conductive contact in electrical contact with the drain region of the SGD transistor. Additional apparatus and methods are disclosed.

14 Claims, 6 Drawing Sheets

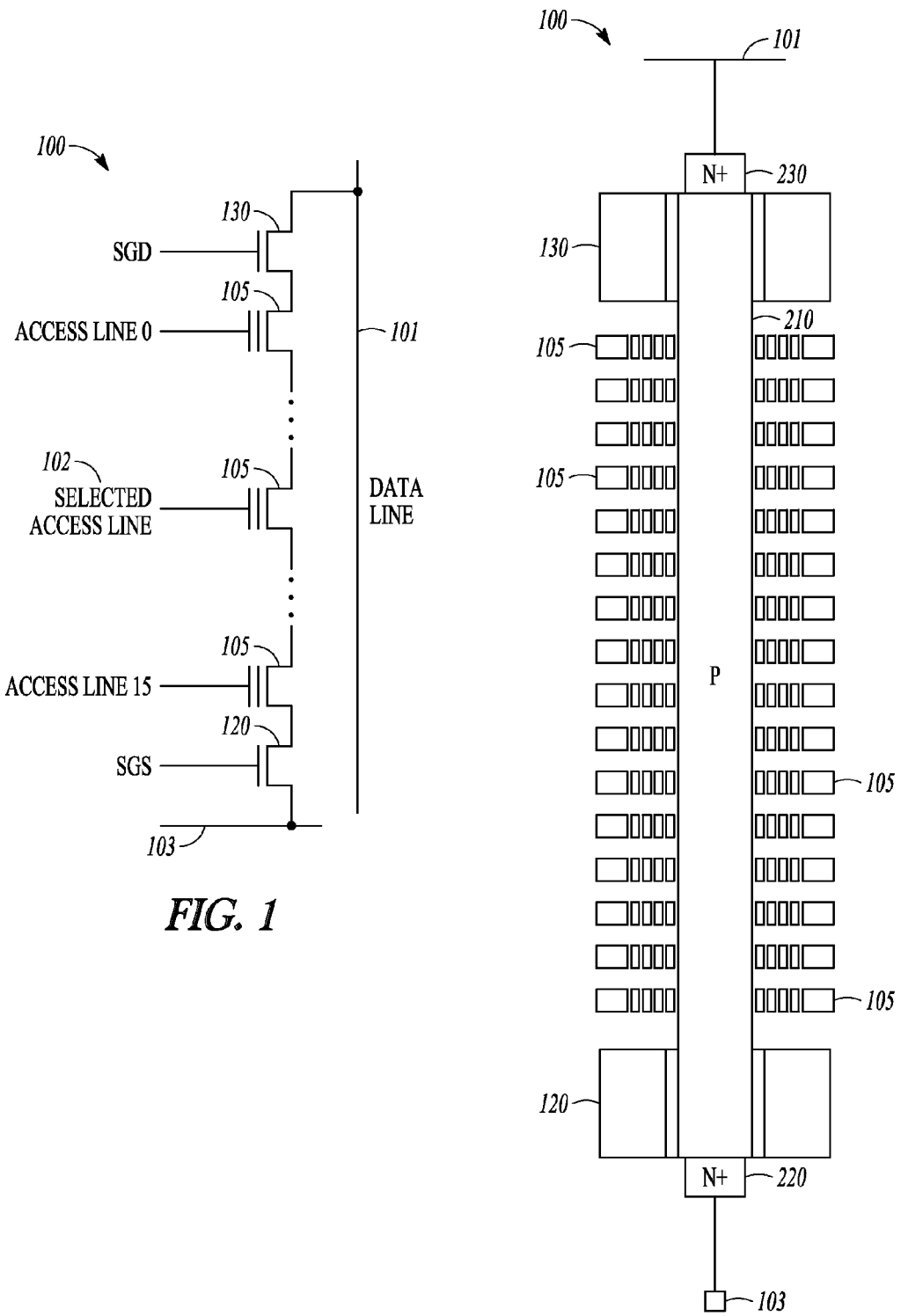

DRAIN SELECT GATE FORMATION METHODS AND APPARATUS

BACKGROUND

A variety of computer systems and electronic devices use memory that is not volatile, so that stored data is not lost when power is disconnected. These nonvolatile memories can be reprogrammed, read, and erased electronically, and are well suited to storing data such as music in digital audio players, pictures in digital cameras, and configuration data in cellular telephones. Such memory includes devices commonly known as flash memory, named in part because a flash operation is used to erase the content of a block of data before it is reprogrammed, and is packaged for consumer use in products such as CompactFlash memory cards, USB flash memory drives, and other such devices.

Flash memory comprises a number of cells, each of which can store one or more binary digits (e.g., bits) of data. A typical flash memory cell comprises a field effect transistor having an electrically isolated charge storage structure such as a floating gate or charge trap that controls electrical conduction in a channel region between source and drain regions of the memory cell. Data values are represented by a charge stored on the charge storage structure, and the resulting change in conductivity observed between the source and drain regions.

When the memory cell is read by placing a specified voltage on the control gate, the electrical impedance between the source and drain of the device will either allow or not allow current to flow, depending on the presence of a charge on the charge storage structure and the effective Vt of the memory cell. The presence or absence of current above a threshold level can be sensed, and used to determine a programmed state of the memory cell, resulting in a particular data value such as a one or zero value being read.

Memory cells can be arranged in a two-dimensional array of rows and columns, where the rows are coupled via an access line, often called a word line, and the columns are coupled via a data line, often called a bit line. The access lines and data lines are used during data read and program operations to select memory cells for reading and programming.

BRIEF DESCRIPTION OF THE FIGURES

FIG. 1 is a schematic diagram of a portion of a three-dimensional not-AND (3D NAND) flash memory array.

FIG. 2 illustrates a cross-sectional view of a semiconductor construction of the vertical string of memory cells of a 3D NAND flash memory array.

DETAILED DESCRIPTION

Figure 3:
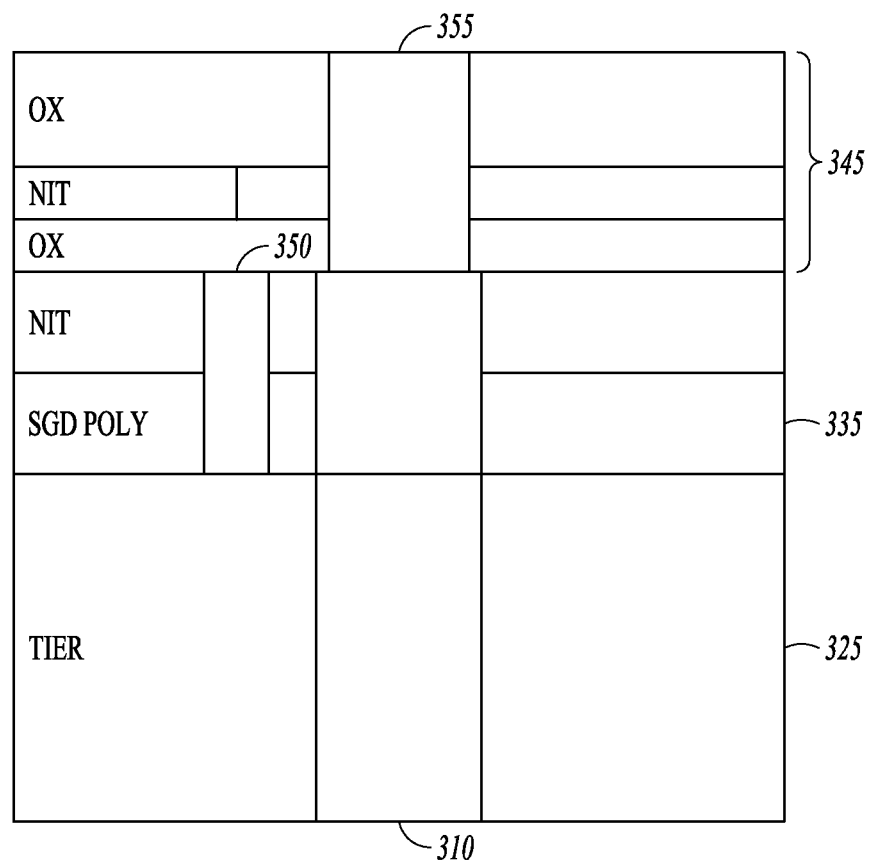
FIG. 3 shows a simplified block diagram of an example of layers included in the formation of a drain select gate (SGD) transistor.

Non-volatile flash memory cells may include a channel region, a control gate and a charge storage structure, such as a floating gate. The control gate is formed of conducting material. The floating gate is not coupled to another conductive element of the memory cell and is instead "floating" in dielectric material. In operation, the floating gate is able to store a charge due to its electrical isolation from other components of the memory cell. Programming or erasing a charge level on the floating gate can be performed via a tunneling process known as Fowler-Nordheim tunneling, in which electrons tunnel through a dielectric separating the floating gate from the channel region. Most flash memory cells are categorized as not-OR (NOR) flash cells or NAND flash cells based on the arrangement of the memory cells or the circuitry used to perform program, read, and erase operations. These types of memory devices can be made from many layers of semiconductor material and their fabrication can involve many steps. The methods, devices, and systems described can increase yield in memory devices by reducing the risk of defects in the forming of the SGD transistors of the memory devices.

FIG. 1 shows a portion of a 3D NAND flash memory array that includes a single data line 101, which is coupled to a vertical string 100 of charge storage memory cells 105. The string of memory cells is coupled in turn to access lines 102, including in this example 16 memory cells numbered 0-15. The string can include more or less than 16 memory cells. The string of memory cells is coupled on the other side of the string to common source line 103, and can be selectively coupled (e.g., electrically connected) or isolated from the source line 103 and data line 101 by source select gate (SGS) transistor 120 and SGD transistor 130.

To perform a program operation for a selected memory cell, the gate of the SGD transistor 130 can be biased to a voltage such that the SGD transistor 130 conducts. The data line 101 can be grounded so that the drain of the selected memory cell is grounded. A bias voltage is applied to the SGS transistor 120 so that the transistor is off. The control gate of the memory cell to be programmed is biased to a high (programming) voltage, such as twenty volts, via the access line 102.

When electrons are stored on the floating gate, they modify the threshold voltage ($V_t$) of the cell. When the cell is "read" by placing a specific voltage on the control gate (e.g., by driving the access line coupled to the cell with a read voltage), electrical current will either flow or not flow between the cell's source and drain connections, depending on the Vt of the cell. This presence or absence of current can be sensed and translated into 1's and 0's, reproducing the stored data.

FIG. 2 is a cross-sectional view of a semiconductor construction of the vertical string 100 shown in FIG. 1 according to various embodiments of the invention. The SGD transistor 130 of the memory cell string is represented by the drain cap 230 and the intersection of the drain select gate with the vertical channel region. The charge storage memory cells 105, the SGS transistor 120 and the SGD transistor 130 surround a pillar 210 of semiconductor material. In certain examples, the charge storage memory cells 105, the SGS transistor 120 and the SGD transistor 130 partially surround the pillar 210 (e.g., extend halfway or more around the pillar). The charge storage memory cells 105 of the vertical string 100 are located in different tiers of the semiconductor construction. The tiers are stacked along the pillar 210 and the pillar 210 is formed orthogonal to the tiers. The charge storage memory cells 105 are formed along a vertical extent of the pillar 210 to form a "vertical" string of charge storage memory cells.

The pillar 210 can comprise p-type polysilicon and is included in a vertical channel region for the charge storage memory cells 105, the SGS transistor 120, and the SGD transistor 130. The pillar 210 extends between a source cap 220 comprising n+ type polysilicon and a drain cap 230 comprising n+ type polysilicon. The source cap 220 is in electrical contact with the pillar 210 and forms a p-n junction with the pillar 210. The drain cap 230 is in electrical contact with the pillar 210 and forms a p-n junction with the pillar 210. The source cap 220 is a source for the pillar 210 and the drain cap 230 is a drain region for the pillar 210. The source cap 220 is coupled to the common source 103, and the drain cap 230 is coupled to the data line 101.

Other embodiments can include different arrangements of the semiconductor material. For example, the pillar can comprise n-type silicon, the source cap 220 can comprise p+ type polysilicon, and a drain cap 230 can comprise p+ type polysilicon. The source cap 220 and the drain cap 230 can form n-p junctions with the pillar 210. In certain embodiments, the pillar is solid and filled with the silicon material. In certain embodiments, the pillar 210 is hollow and has an air gap in the center or be filled with a dielectric core. In certain embodiments, the SGD transistor does not include a separate drain cap 230. Instead, the drain region is formed in the pillar 201 by doping the end region of the pillar 201.

FIG. 3 shows a simplified block diagram of layers included in an approach in the formation of portions of an SGD transistor. The block diagram shows a tiered semiconductor construction 325 that comprises a vertical string of charge storage devices. The block diagram also shows a pillar 310 of semiconductor material in the tiered semiconductor construction 325. Formed above the top tier of the semiconductor construction is a layer of polysilicon 335 for the gate of the SGD transistor. A layer of nitride 340 sits on top of the layer of polysilicon 335. Formed in the nitride layer and the polysilicon layer is a dielectric barrier 350. Above the nitride layer 340 is an isolation layer and a metal contact 355 is shown formed in the isolation layer. The metal contact 355 provides electrical connection to a data line.

The methods disclosed herein operate to reduce or eliminate the possibility of excessive etching, so that the SGD transistor will be properly formed when the methods are used. For instance, a problem can arise if the masking and etching to form an opening for the metal contact 355 drifts off center from the pillar 310. The etching process may progress into the dielectric barrier 350. If the etching progresses too far, filling the opening with metal may result in a short between data line and the gate of the SGD transistor and possibly the pillar 310.

Figure 4:
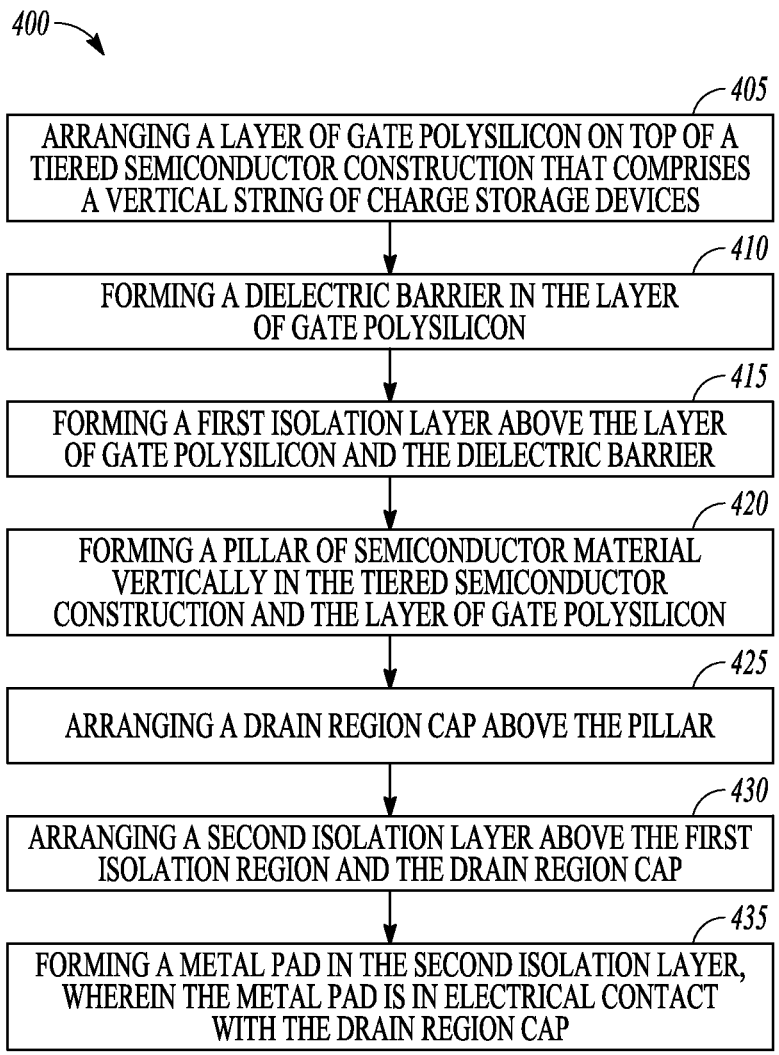
FIG. 4 is a flow diagram of a method of forming an SGD transistor for a memory device.
Figure 5:
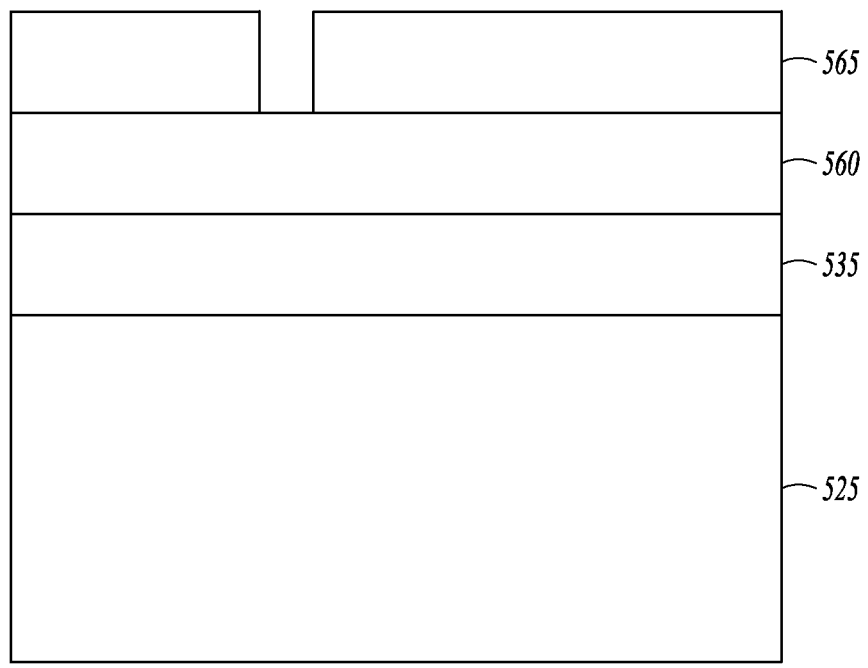
FIGS. 5-9 show examples of stacks of semiconductor material.

FIG. 4 is a flow diagram of a method 400 of forming an SGD transistor for a memory device. At 405, a layer of gate polysilicon is formed on top of a tiered semiconductor construction that comprises a vertical string of charge storage devices. FIG. 5 shows a simple block diagram of an example of a layer of SGD polysilicon 535 formed on a tiered construction 525. The tiered construction 525 can include the vertical string of charge storage devices formed as a stack of layers. The stack can include layers of charge storage devices alternating with layers of dielectric material. The layers of charge storage devices can be memory cells that include floating gates control gates and charge isolating structures. The layers of dielectric material can include one or more of silicon dioxide and alumina. The layer of gate polysilicon may be formed above a top dielectric layer (e.g., a layer of alumina) of the tiered construction 525.

At 410 of FIG. 4, a dielectric barrier is formed in the layer of gate polysilicon. The barrier can be formed by patterning and etching using sacrificial layers 560 and 565 in FIG. 5. A mask layer 565 can be formed above the layer of gate polysilicon. An opening for the dielectric barrier is etched into the layer of gate polysilicon. The opening is filled with dielectric material to form the dielectric barrier.

Figure 6:
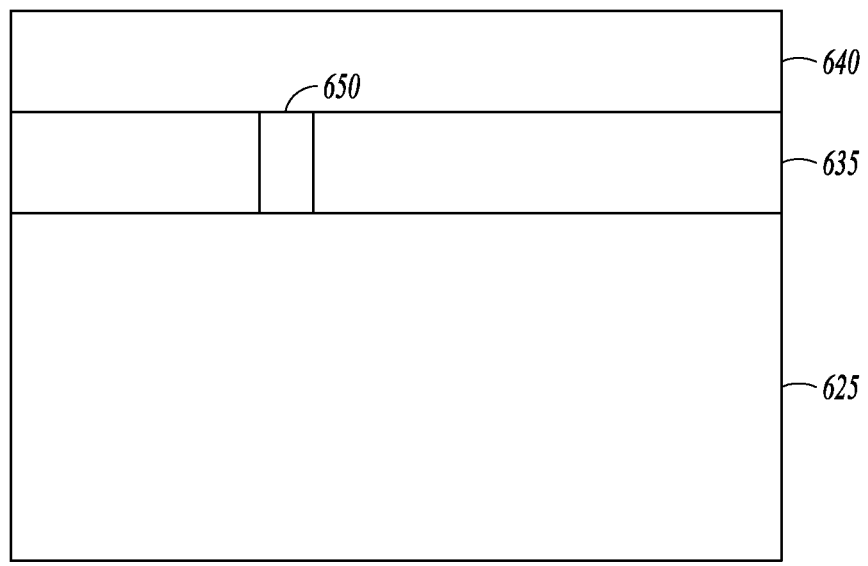

FIG. 6 shows a block diagram of an example of the dielectric barrier 650 formed in the layer of gate polysilicon 635. The gate polysilicon can be used to form the drain select gate for the SGD transistor. The dielectric barrier 650 provides isolation for the SGD transistor.

At 415 of FIG. 4, a first isolation layer is formed above the layer of gate polysilicon 635 and the dielectric barrier 650. This is shown in the Example of FIG. 6 as nitride layer 640. In certain embodiments, the nitride layer 640 is formed after chemical-mechanical planarization (CMP) of the gate polysilicon layer and dielectric barrier. The opening for the dielectric barrier can be filled prior to forming the first isolation layer above the gate polysilicon layer 635. This results in the dielectric barrier 650 not extending into the first isolation layer.

Figure 7:
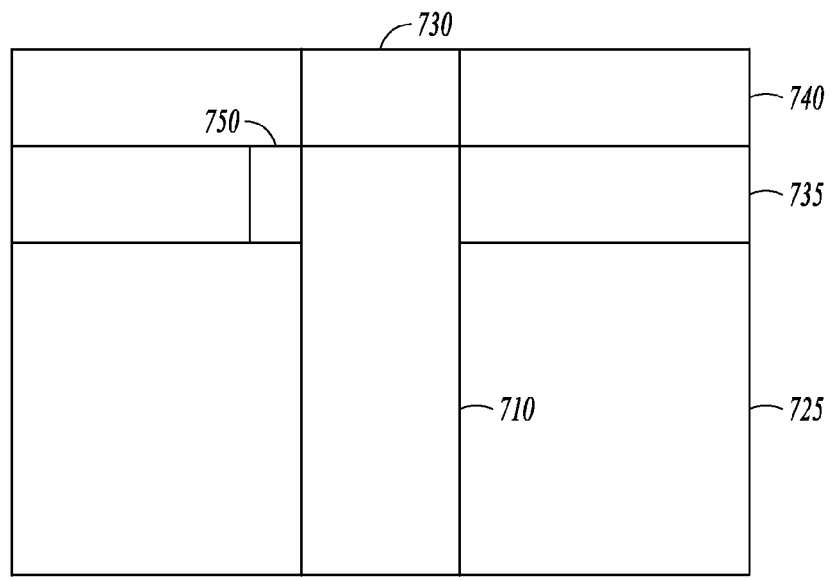
Figure 9:
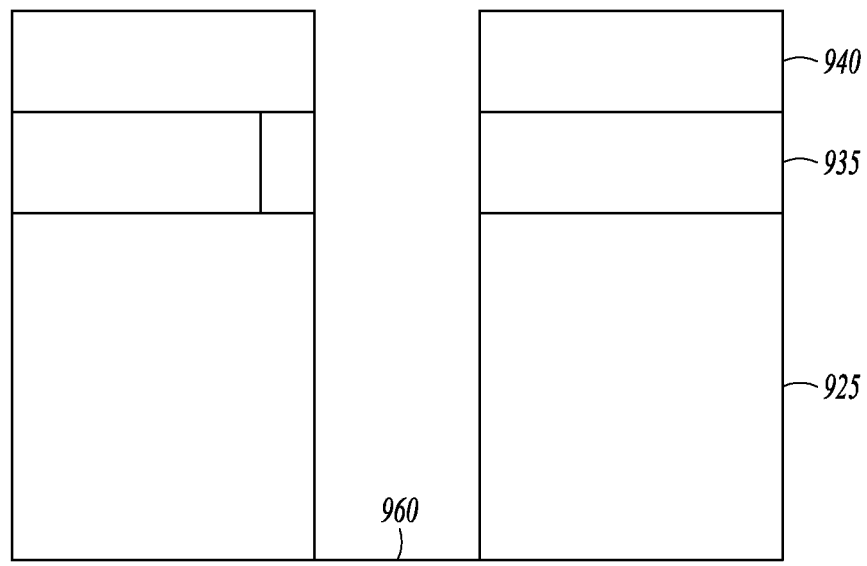

At 420 of FIG. 4, a pillar of semiconductor material is formed vertically in the tiered semiconductor construction and the layer of gate polysilicon. This is shown in the example of FIG. 7 where the pillar 710 is formed in tiered construction 725 and SGD polysilicon 735. The SGD polysilicon surrounds the pillar at least partially. As shown in FIG. 9, a trench 960 can be formed in the layers of the tiered construction 925, the layer of gate polysilicon 935, and the first isolation layer 940. The trench may then be filled with polysilicon to form the pillar 710 in FIG. 7. In certain examples, the trench is filled to a level below the first isolation layer (e.g., nitride layer 740), and in certain examples, the pillar 710 is filled to a level within the first isolation layer. In some examples, the trench is filled to have a hollow core that includes an air gap or is filled with dielectric material to form a pillar with a dielectric core.

At 425 of FIG. 4, a drain region is formed at the end of the pillar. In some examples, the drain region is formed as a drain region cap (e.g., drain cap 230 in FIG. 2) is formed above the pillar 710. In certain examples, the drain cap 730 is formed above the pillar 710 in the isolation region. For instance, the trench for the pillar 710 may be filled with a first type (e.g., p-type) of polysilicon to a level below the top surface of the first isolation region. The remaining portion of the trench may be filled with a second type of polysilicon (e.g., n-type) to form the drain region cap. The p-type pillar and the n-type drain region cap form a p-n junction. In some examples, the drain region is formed within the end of the pillar. For instance, the channel region of the SGD device can be doped to form the drain region at he end of the pillar.

In some examples, the drain region cap 730 is formed above the pillar and above the isolation layer. The trench is filled to the top surface of the first isolation layer with a first type of polysilicon to form the pillar.

Figure 8:
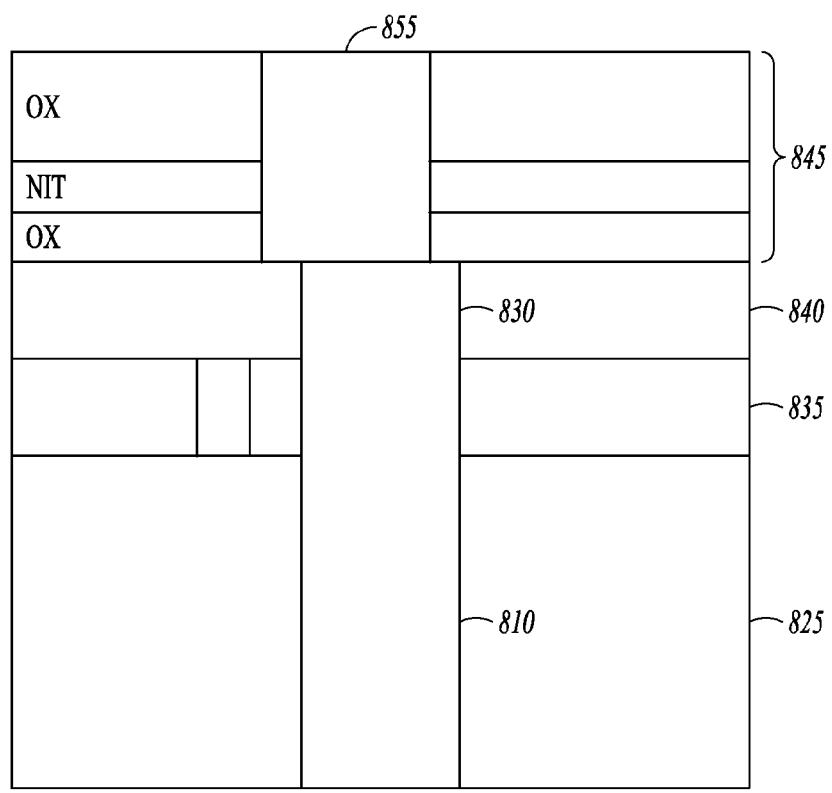

At 430 of FIG. 4, a second isolation layer is formed above the first isolation layer and the drain region cap. The second isolation layer is shown in the example of FIG. 8 as second isolation layer 845 above first isolation layer 840 and drain region cap 830. In certain variations, the second isolation layer 845 is a composite layer of an oxide sub-layer, a nitride sub-layer, and an oxide sub-layer as shown in the example of the Figure. In certain variations, the second isolation layer 845 is a single layer of oxide. In certain examples, the drain region cap 830 can be formed in a portion of the second isolation region (e.g., forming an opening in the second isolation region by masking and etching and filling the opening with a second type polysilicon).

At 435 of FIG. 4, a metal contact is formed in the second isolation layer. This is shown as metal contact 855 in the example of FIG. 8. The metal contact 855 may provide electrical contact with the drain region cap 830 and a data line (e.g., data line 101 in FIG. 2). The metal contact 855 may be formed by masking and etching to form an opening for the metal contact 855 and then filling the opening with metal. The first isolation layer 840 functions as a landing layer for the second isolation layer 845. The first isolation layer 840 protects against the masking and etching steps used to form the opening for the metal contact 855 from progressing to the layer of gate polysilicon 835 or the pillar 810, even when the metal contact 855 is formed off target and misaligned as shown in the example of FIG. 8. Thus, the method of FIG. 4 is a robust process of forming an SGD transistor.

The structure in FIG. 8 can be included in a memory device (e.g., a 3D NAND memory device). The tiered construction 825 can include layers of charge storage devices alternating with layers of dielectric material, such as the charge storage devices shown in FIG. 2. The drain region cap 830 may be the drain region for the SGD transistor of FIG. 2 and the metal contact may contact the data line 101 in FIG. 2. The gate polysilicon layer 835 and dielectric barrier 850 may form the gate for the SGD transistor, and the pillar 810 may be the channel region for the SGD transistor and a vertical channel for the charge storage devices formed in the tier. The pillar 810 may also be the channel region for the SGS transistor in FIG. 2. The methods, devices, and systems described above can increase yield in memory devices by reducing the risk of defects in the forming of the SGD transistors of memory devices. Creating a robust process for the formation of these memory devices can increase yield and thereby lower the fabrication cost.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract of the Disclosure is submitted with the understanding that it will not be used to interpret or limit the scope or meaning of the claims.

What is claimed is:

1. An apparatus comprising:
   a string of charge storage devices formed along a vertical channel of semiconductor material and coupled together in series, wherein tire string of charge storage devices includes multiple memory cells formed vertically along the vertical channel;
   a gate region of a drain select gate (SGD) transistor, the gate region at least partially surrounding the vertical channel and included in a layer of gate polysilicon;
   a dielectric isolation barrier formed in the layer of gate polysilicon;
   a first isolation layer comprising a long surface and a short surface above the layer of gate polysilicon and the dielectric barrier;
   a drain region of the SGD transistor within the first isolation layer; and
   a second isolation layer comprising a long surface and a short surface above the first isolation layer and the drain region, and the long surface of the second isolation layer contacting the long surface of the first isolation layer, wherein a conductive contact extends through the second isolation layer in electrical contact with the drain region of the SGD transistor, and wherein the multiple memory cells extend vertically from the SGD transistor.

2. The apparatus of claim 1, wherein the gate region of the SGD transistor includes a layer of polysilicon at least partially surrounding the vertical channel, and wherein the dielectric barrier is formed within the layer of polysilicon.

3. The apparatus of claim 1, wherein the gate region of the SGD transistor includes a layer of polysilicon at least partially surrounding the vertical channel, and wherein the first isolation layer extends from a top surface of the layer of polysilicon to the top surface of the vertical channel.

4. The apparatus of claim 1, wherein the gate region of the SGD transistor includes a layer of polysilicon at least partially surrounding the vertical channel, and wherein the first isolation layer extends from the layer of polysilicon to the top surface of the drain region.

5. The apparatus of claim 1, wherein the vertical channel is a channel region for the charge storage devices and the SGD transistor.

6. The apparatus of claim 1, wherein the second isolation layer includes an oxide sub-layer and a nitride sub-layer.

7. The apparatus of claim 1, wherein the vertical string of charge storage devices are formed as a stack, including layers of charge storage devices alternating with layers of dielectric material, and wherein the vertical channel includes a pillar of semiconductor material formed in the stack.

8. The apparatus of claim 7, wherein one or more of layers of dielectric material include alumina.

9. The apparatus of claim 7, wherein one or more of the layers of charge storage devices include a transistor having a control gate and a floating gate.

10. The apparatus of claim 1, wherein the vertical channel includes p-type polysilicon and the drain region includes n-type polysilicon.

11. The apparatus of claim 1, wherein the vertical channel includes n-type polysilicon and the drain region includes p-type polysilicon.

12. The apparatus of claim 1, wherein the vertical string of charge storage devices are included in a NAND memory device.

13. A memory device comprising: a string of charge storage devices formed along a vertical channel of semiconductor material
   and coupled together in series, wherein the string of charge storage devices includes a plurality of memory cells formed vertically along the vertical channel;
   a gate region of a drain select gate (SGD) transistor, the gate region at least partially surrounding the vertical channel and included in a layer of gate polysilicon;
   a dielectric barrier formed in the layer of gate polysilicon;
   a first isolation layer comprising a long surface and a short surface above the layer of gate polysilicon and the dielectric barrier;
   a drain region of the SGD transistor at an end of the vertical channel and within the first isolation layer;
   a second isolation layer comprising a long surface and a short surface above the first isolation layer and the drain region, and the long surface of the second isolation layer contacting the long surface of the first isolation layer, wherein a conductive contact extends through the second isolation in electrical contact with the drain region of the SGD transistor at the end of the vertical channel and the plurality of memory cells extend vertically from the SGD transistor; and
   a data line in electrical contact with the conductive contact.

14. The memory device of claim 13, wherein the gate region of the SGD transistor includes a layer of polysilicon at least partially surrounding the vertical channel, and wherein the dielectric barrier is formed within the layer of polysilicon.

\* \* \* \* \*